United States Patent
Mizushima

(10) Patent No.: US 6,903,025 B2
(45) Date of Patent: Jun. 7, 2005

(54) METHOD OF PURGING SEMICONDUCTOR MANUFACTURING APPARATUS AND METHOD OF MANUFACTURING SEMICONDUCTOR DEVICE

(75) Inventor: Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/608,020

(22) Filed: Jun. 30, 2003

(65) Prior Publication Data

US 2004/0002220 A1 Jan. 1, 2004

Related U.S. Application Data

(63) Continuation of application No. PCT/JP02/08742, filed on Aug. 29, 2002.

(30) Foreign Application Priority Data

Aug. 30, 2001 (JP) ........................................ 2001-262295

(51) Int. Cl.[7] ...................... H01L 21/302; H01L 21/461
(52) U.S. Cl. ........................ 438/706; 438/563; 438/785; 438/685; 438/680; 438/905; 216/58; 216/79; 156/646.1; 134/22.1
(58) Field of Search ................................. 438/706, 785, 438/680, 563, 905, 685; 427/38, 39; 216/58, 79; 156/646.1; 134/22.1

(56) References Cited

U.S. PATENT DOCUMENTS 4,563,367 A * 1/1986 Sherman ...................... 427/563
5,129,958 A * 7/1992 Nagashima et al. ....... 134/22.1
5,609,721 A    3/1997 Tsukune et al.
5,888,906 A    3/1999 Sandhu et al.
5,963,834 A   10/1999 Hatano et al.
2002/0006739 A1 * 1/2002 Yamamoto ................... 438/785

FOREIGN PATENT DOCUMENTS

| JP | 63-70428  | 3/1988  |
| JP | 1-152274  | 6/1989  |
| JP | 2-190472  | 7/1990  |
| JP | 5-259133  | 10/1993 |
| JP | 5-302172  | 11/1993 |
| JP | 5-315297  | 11/1993 |
| JP | 5-331630  | 12/1993 |
| JP | 6-163485  | 6/1994  |

OTHER PUBLICATIONS

Mitani et al., "Reexamination of Fluorine Incorporation into $SiO_2$ Significant Improvement of Charge-to-breakdown Distribution Tail," IEEE 37th Annual International Reliability Physic Symposium (1999), pp. 93–98.

* cited by examiner

Primary Examiner—Matthew Smith
Assistant Examiner—B. V. Keshavan
(74) Attorney, Agent, or Firm—Finnegan, Henderson, Farabow, Garrett & Dunner, L.L.P.

(57) ABSTRACT

A method of purging a semiconductor manufacturing apparatus comprises a step of etching a CVD-deposited film deposited in a chamber constituting a semiconductor manufacturing apparatus which has performed a process of forming a CVD film using a CVD process over a semiconductor wafer by using an etching gas containing at least a halogen gas, and a step of purging a cleaning gas remaining in the chamber by causing a gas containing hydrogen to flow into the chamber after the step of etching the CVD-deposited film by using the cleaning gas.

40 Claims, 1 Drawing Sheet

METHOD OF PURGING SEMICONDUCTOR MANUFACTURING APPARATUS AND METHOD OF MANUFACTURING SEMICONDUCTOR DEVICE

CROSS-REFERENCE TO RELATED APPLICATIONS

This is a Continuation Application of PCT Application No. PCT/JP02/08742, filed Aug. 29, 2002, which was not published under PCT Article 21 (2) in English.

This application is based upon and claims the benefit of priority from the prior Japanese Patent Application No. 2001-262295, filed Aug. 30, 2001, the entire contents of which are incorporated herein by reference.

BACKGROUND OF THE INVENTION

1. Field of the Invention

The present invention relates to a process of purging a semiconductor manufacturing apparatus, more specifically, to a purge step for a CVD (chemical vapor deposition) apparatus after dry-cleaning step.

2. Description of the Related Art

When a semiconductor manufacturing apparatus, for example, a CVD apparatus such as a LP (low pressure)-CVD apparatus is used, silicon, silicon oxides, silicon nitrides, and/or thin-film materials to be used in a semiconductor device are deposited within a reaction chamber (which Hereinafter will be referred as a "chamber") of the manufacturing apparatus. When such a CVD-deposited film is formed excessively thick, a problem occurs that peel of the film occurs, and inside of the chamber is thereby contaminated. In addition, when the film peel has occurred to make the thickness of deposited films in the chamber non-uniform, CVD films formed over semiconductor wafers are not formed to be uniform. Then, conventionally, before such problem become remarkable, an etching process is performed to remove the deposited films by using a cleaning gas containing halogen such as $ClF_3$ or $F_2$. Generally, when the film thickness over a monitor wafer placed in the chamber has exceeded a predetermined level, the inside of the chamber is dry-cleaned for a time determined to be sufficient by experience.

As described above, the deposited film deposited on the inside of the chamber is removed by dry-cleaning by using the etching gas such as $ClF_3$. By the way, after the cleaning by using the etching gas such as $ClF_3$, it is necessary to sufficiently purge the residual etching gas (displacement purge) in the chamber, before ordinary CVD processes after the cleaning are performed.

However, since the etching gas such as $ClF_3$ contains halogen of high electronegativity, then the etching gas adsorbed in the chamber surface can not be sufficiently desorbed through a short-time purge treatment. As the result, conventionally, a long-time purge treatment has been required.

In a CVD mode in which it is sufficient that the chamber cleaning is performed in a low cleaning frequency, even long purge time after cleaning does not arise a serious problem. However, in a CVD mode in which cleaning needs to be performed every time a CVD process is performed, long purge time leads to a reduction in the throughput.

BRIEF SUMMARY OF THE INVENTION

The present invention is made under the circumstances described above, and it is an object of the invention to provide a method of purging a semiconductor manufacturing apparatus such as a CVD apparatus by shorting purge time to increase the rate of apparatus operation and increase the productivity and to provide a method of manufacturing a semi-conductor device using a semiconductor manufacturing apparatus purged by the purging method.

The invention is characterized in that dry-cleaning is performed using a cleaning gas containing halogen such as $ClF_3$ for the inside of a chamber constituting a semiconductor manufacturing apparatus which has performed a processes of forming a CVD film over a semiconductor wafer by using a CVD process; and in a purge step to be performed thereafter, there is used a gas such as nitrogen, argon or oxygen, or a mixture thereof, containing any one of such materials as (1) hydrogen, (2) water-vapor, and (3) ammonia that react with water to be a base.

That is, a method of purging a semiconductor manufacturing apparatus of the present invention is characterized by comprising: a step of etching a CVD-deposited film deposited in a chamber constituting a semiconductor manufacturing apparatus which has performed a process of forming a CVD film by using a CVD process over a semiconductor wafer, by using an etching gas containing at least a halogen gas; and a step of purging the cleaning gas remaining in the chamber by causing a gas containing hydrogen to flow into the chamber after the step of etching the CVD-deposited film by using the cleaning gas.

Further, a method of purging a semiconductor manufacturing apparatus of the present invention is characterized by comprising: a step of etching a CVD-deposited film deposited in a chamber constituting a semiconductor manufacturing apparatus which has performed a process of forming a CVD film by using a CVD process over a semiconductor wafer, by using an etching gas containing at least a halogen gas; and a step of purging the cleaning gas remaining in the chamber by causing a gas containing water-vapor to flow into the chamber after the step of etching the CVD-deposited film by using the cleaning gas.

Furthermore, a method of purging a semiconductor manufacturing apparatus of the present invention is characterized by comprising: a step of etching a CVD-deposited film deposited in a chamber constituting a semiconductor manufacturing apparatus which has performed a process of forming a CVD film by using a CVD process over a semiconductor wafer, by using an etching gas containing at least a halogen gas; and a step of purging the cleaning gas remaining in the chamber by causing a gas containing a substance, which becomes alkali upon being dissolved in water, to flow into the chamber after the step of etching the CVD-deposited film by using the cleaning gas.

Moreover, a method of purging a semiconductor manufacturing apparatus of the present invention is characterized by comprising: a step of etching a CVD-deposited film deposited in a chamber constituting a semiconductor manufacturing apparatus which has performed a process of forming a CVD film by using a CVD process over a semiconductor wafer, by using an etching gas containing at least a halogen gas; and a step of purging the cleaning gas remaining in the chamber by causing an ammonia gas to flow into the chamber after the step of etching the CVD-deposited film by using the cleaning gas.

A method of manufacturing a semiconductor device of the present invention is characterized by comprising: a step of mounting a semiconductor wafer in a chamber purged using the method of purging a semiconductor manufacturing apparatus according to any one of claims 1, 5, 9, 12; and a step of forming a CVD film over the semiconductor wafer mounted in the chamber.

Further, in the aspect of the invention as described in any one of claims 1, 5, 9, and 12, the invention may be arranged to have a following configuration: (1) purge completion is determined by monitoring residual gas remaining in the chamber; (2) the residual gas is monitored according to mass spectroscopy of the residual gas; (3) in the step of purging, the exhaust rate is changed by changing the chamber pressure; (4) pressure variation values of the pressure variations are made to be different by three digits or more; (5) in the step of purging, the temperatures of the chamber and an exhaust tube connected to the chamber are set higher than temperatures applied when the CVD film is formed; and (6) the residual gas remaining in the chamber is used as a doping gas in a subsequent process.

DETAILED DESCRIPTION OF THE INVENTION

A first embodiment will be described with reference to FIG. 1.

Figure 1:
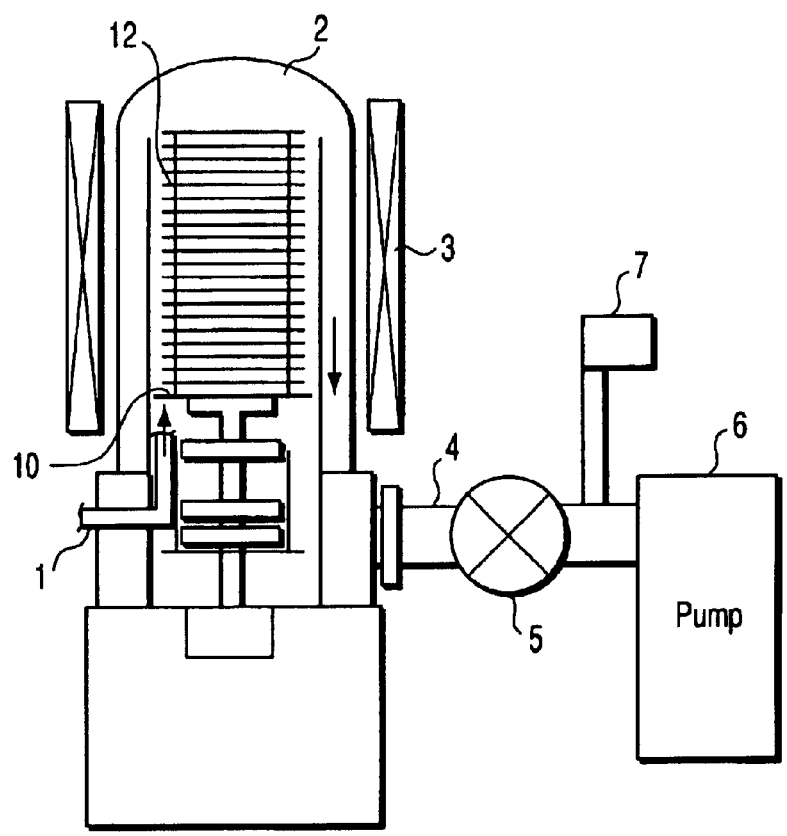
FIG. 1 is a schematic cross-sectional view of a CVD apparatus according to an embodiment of the present invention.

FIG. 1 shows a schematic cross-sectional view of a vertical type CVD apparatus, which is used as a semiconductor manufacturing apparatus. A boat 10 is provided in a vertical type chamber 2, and semi-conductor wafers 12 such as silicon wafers are mounted on the boat prior to a CVD process. A gas inlet 1 is mounted on a lower portion of the chamber 2, and a cleaning gas is introduced into the chamber 2 through the gas inlet, upon operation of a mass-flow control valve (not shown). A heater 3 is disposed in an outer portion of the chamber 2 to heat semiconductor wafers 12 mounted on the boat 10. The chamber 2 is connected to a pump 6 via an exhaust tube 4 having a pressure control valve 5, in which operation of the pressure control valve 5 exhausts the chamber to appropriate pressure.

Using the CVD apparatus shown in FIG. 1, a silicon film was formed by an LP-CVD process over the semi-conductor wafers 12 provided on the boat 10. Subsequently, dry-cleaning was performed for the inside of the chamber by using $ClF_3$ as a cleaning gas. The inside of the chamber before the dry-cleaning was in a state where a silicon film of approximately 300 nm was deposited. The dry-cleaning conditions applied in this case are as follows. That is, to remove the silicon film in the chamber, the chamber was once depressurized and thereafter 900 sccm of the $ClF_3$ diluted with 1600 sccm nitrogen ($N_2$) was supplied into the chamber maintained with a chamber temperature of 350° C. and a chamber pressure of 20 Torr to react with the deposited silicon film in the chamber. Since the reaction between the $ClF_3$ gas and the silicon film is an exothermic reaction, then the completion of cleaning can be determined by monitoring the indication of a thermometer (not shown) provided in the chamber or the power of the heater that heats the chamber and judging the variation thereof.

Upon completion of cleaning, the supply of the $ClF_3$ gas and nitrogen was stopped, and in this state the inside of the chamber was subjected to exhausting for 2 minutes. The pressure at the time of the inside of the chamber was 0.8 mTorr. Subsequently, a mixed gas of 5 slm nitrogen and 5 slm hydrogen ($H_2$) was supplied into the inside of the chamber for 2 minutes. The pressure at the time in the inside of the chamber was 100 Torr. The exhausting step and the mixture-gas supply step were set as one cycle purge process, and three cycle purge processes were repeated in total. As a result, no residual $ClF_3$ gas was detected with a monitoring quadrupole-mass (Q-mass) spectrometer 7. Further, no Cl nor F, which is formed after decomposition of $ClF_3$, was detected. Thus, it was confirmed that a sufficient purge was achieved.

For comparison with the above, similar monitoring was performed using the Q-mass spectrometer for a case where instead of the hydrogen-nitrogen mixture gas, 10 slm nitrogen was caused to flow. As a result of the same number of repetitions (three times) as in the above case, residues of materials such as Cl were observed, and it was confirmed that the purge was insufficient.

The reason for that $ClF_3$ was efficiently removed by the purge using the hydrogen-containing gas is considered that hydrogen and $ClF_3$ react with each other as expressed by the formula shown below, and the residual $ClF_3$ was removed.

$$ClF_3 + 2H_2 \rightarrow HCl + 3HF \tag{1}$$

The addition amount of hydrogen in the present embodiment was 5 slm, which amount is the same as that of nitrogen, however, the amount of hydrogen is not limited thereto, and 100% hydrogen (that is, hydrogen alone) may be used. Similarly, while the flow rate was set to 5 slm in the present embodiment, it may be set to a range of from 10 sccm to 10 slm, in which the addition effect can be exhibited. Similarly, while the nitrogen flow rate was set to 5 slm in the present embodiment, it may be in a range of from 0 sccm to 10 slm. A case where a mixture gas of hydrogen in a range of from 10 sccm to 10 slm and nitrogen in a range of from 0 sccm to 10 slm was supplied was compared with a case where only nitrogen was supplied, and it was confirmed that purging was attained in a short time.

According to the present embodiment, the purge time can be shortened, and the operation rate of the apparatus can be increased.

Hereinafter, a second embodiment of the present invention will be described.

Also in this embodiment, cleaning was performed using the $ClF_3$ gas for the inside of a chamber in a state where a silicon film is deposited to the inside of the chamber, as in the first embodiment.

The purge after the cleaning was performed with a mixed gas of 5 slm nitrogen and 25 sccm water-vapor ($H_2O$). The chamber pressure at the time was 100 Torr, and hence the water-vapor partial pressure was 0.5 Torr (i.e. 0.5 mmHg). Similarly to the case of the first embodiment, the purge cycle of the exhausting step and the gas supply step was repeated five times in total for comparison. When monitoring is made using the Q-mass spectrometer, it was confirmed that residual gases such as HCl and HF, which are considered attributable to the $ClF_3$ gas, were not present.

For comparison, in a case where alone nitrogen was caused to flow, it was confirmed that HF and HCl remained with the same number of purge cycles (5 times), and thus it is determined that HF and HCl can be efficiently removed by adding the water-vapor as in the present embodiment.

In the present embodiment, while the flow rate of the water-vapor was set to 25 sccm, it may be set to a range of from 5 sccm to 500 sccm, in which the addition effect can be exhibited. Similarly, while the nitrogen flow rate was set to 5 slm in the present embodiment, it may be in a range of from 10 sccm to 10 slm.

A case where a mixed gas of water-vapor in a range of from 5 sccm to 500 sccm and nitrogen in a range of from 10 sccm to 10 slm was applied was compared with a case where only nitrogen was applied. As a result, it was determined that residual gases such as HCl and HF were not present.

The reason for that HF and HCl were removed by adding water-vapor is considered that the water-vapor and $ClF_3$ react with each other as expressed by the formula as shown below, and both HF and HCl were able to be desorbed:

$$ClF_3 + 2H_2O \rightarrow 3HF + HCl + O_2 \quad (2)$$

Thus, with the water-vapor being supplied at the time in the purge process, residual HF and HCl amounts can be decreased.

However, in the water-vapor added purge process, while the amounts of residual HF and HCl can be decreased just after the purge process, residual water-vapor causes an undesirable reaction in subsequent processes such as a CVD process and a cleaning process. For example, in a CVD process using $SiH_4$ for a silicon film, $SiH_4$ and $H_2$ react with each other as expressed by the formula as shown below, thus generating $SiO_2$.

$$SiH_4 + 2H_2O \rightarrow SiO_2 + 4H_2 \quad (3)$$

Further, in the cleaning process, when the $ClF_3$ gas is caused to flow, the water-vapor and $ClF_3$ undesirably react with each other as shown in formula (2), thus generating HF and HCl. To prevent this, it is preferable that a purge process is performed with a gas not containing water-vapor, subsequently to the purge process with the gas containing water-vapor. Conditions for the subsequent purge process may be set, for example, by excluding the added water-vapor from the above-described conditions with the water-vapor being added.

For a method for adding the water-vapor for the purge process, Jpn. Pat. Appln. KOKAI Publication No. 5-331630 describes a method "Method for Removing Chlorine Trifluoride Gas". This publication describes that it is preferable that air or gas containing water-vapor with a partial pressure of 1 mmHg as the adding amount or higher is used. However, in the present embodiment, it was confirmed that water-vapor addition effect is exhibited even with a water-vapor partial pressure lower than 1 mmHg. According to the present embodiment, it was confirmed that, with a water-vapor partial pressure of 0.05 Torr (=0.05 mmHg) or higher, sufficient water-vapor addition effect can be obtained. In addition, the publication referenced above does not describe a problem that water-vapor remains in a practical application while it describes only the process of adding the water-vapor to air or nitrogen. Nor does the publication describe that a subsequent purge process is performed using a gas not containing water-vapor, after the purge process after adding water-vapor.

According to the present embodiment, the purge time can be shortened, and the operation rate of the apparatus can be increased.

Hereinafter, a third embodiment of the present invention will be described.

Also in this embodiment, cleaning was performed using the $ClF_3$ gas for the inside of the chamber in a state where a silicon film is deposited to the inside of the chamber, as in the first embodiment.

A purge process after the cleaning was performed with a mixed gas of 2 slm nitrogen and a 500 sccm ammonia ($NH_3$). The purge cycle of the exhausting step and the gas supply step was repeated three times in total for comparison. When monitoring was performed using the Q-mass spectrometer, then it was confirmed that residual gases such as HCl and HF, which are considered attributable to the $ClF_3$ gas, were not present at all.

In the present embodiment, while the ammonia flow rate was set to 500 sccm, it may be set to a range of from 100 sccm to 2 slm, in which the addition effect can be exhibited. Similarly, while the nitrogen flow rate was set to 2 slm in the present embodiment, it may be in a range of from 10 sccm to 10 slm.

A case where a mixed gas of ammonia in a range of from 100 sccm to 2 slm and nitrogen in a range of from 10 sccm to 10 slm was supplied was compared with a case where nitrogen alone was supplied. As a result, it was confirmed that residual gases such as HCl and HF were not present.

The reason for that HF, HCl and the like were removed by the purge process using the added ammonia is that, when $ClF_3$ was caused to flow, $ClF_3$ and residual water-vapor in the chamber reacted with each other, and HF, HCl and the like generated by the reaction reacted with $NH_3$ to thereby generate $NH_4F$, $NH_4Cl$ and the like. In this way, HF, HCl and the like, which are acid remained in the chamber, change to $NH_4F$, $NH_4Cl$ and the like, which are more stable salts, thus resulting in reduction of corrosion of metal portions of the inside of the apparatus which are easy to corrode. In addition, when ammonia is caused to flow, an effect can be expected to prevent that a quartz chamber surface is nitrided, and halogen remaining in the quartz itself is desorbed into the chamber. This effect depends on the temperature when ammonia is caused to flow, and it is preferable that the temperature is set to 800° C. or higher, thereby enabling the effect to be significant.

In the present embodiment, ammonia was used as the additive gas. However, gases which are neutralized with HF, HCl and the like which are acid may be used as gases which react with HF, HCl and the like, and for example, a substance such as NaOH or KOH that changes to alkali when it is dissolved in water may be used.

According to the present embodiment, the purge time can be shortened, and the operation rate of the apparatus can be increased.

Hereinafter, a fourth embodiment of the present invention will be described with reference to FIGS. 1 and 2.

Figure 2:
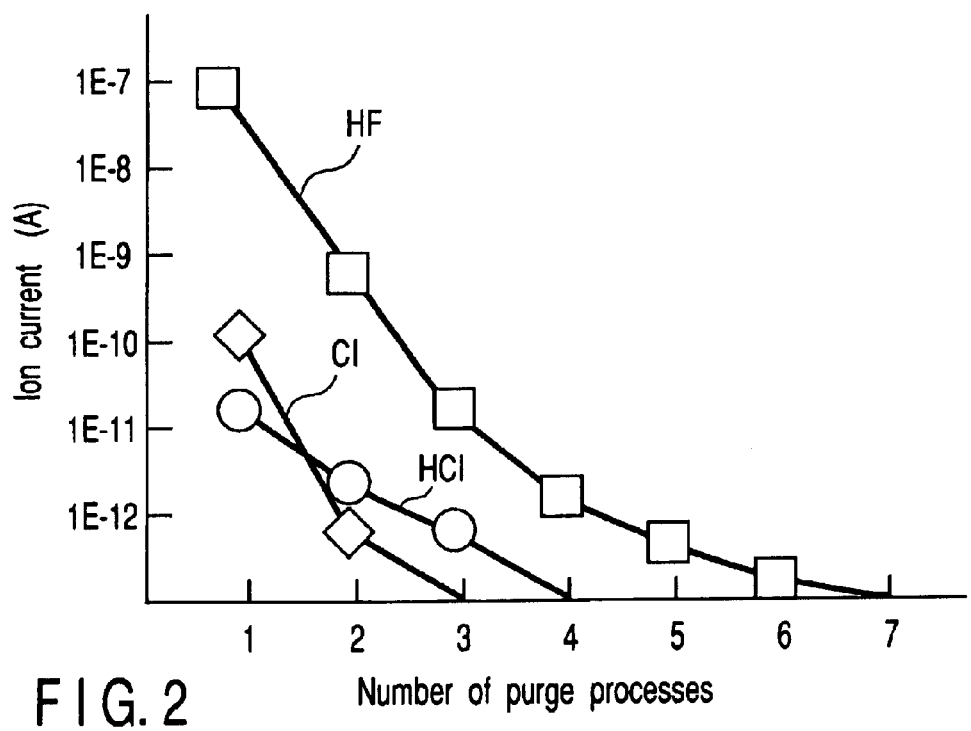
FIG. 2 shows a characteristic curve graph indicating purge characteristics according to the embodiments of the present invention.

FIG. 2 is a characteristic diagram showing number-of-purge-processes dependency characteristics of ion currents corresponding to residual gases. Also in this embodiment, cleaning was performed using the $ClF_3$ gas for the inside of the chamber in a state where a silicon film is deposited to the inside of the chamber, as in the first embodiment.

A purge process after the cleaning was performed by causing 5 slm nitrogen to flow. The mass numbers of HF, HCl, and Cl were measured in units of a exhausting step by using the quadruple-mass (Q-mass) spectrometer 7 (refer to FIG. 1) provided on the exhaust side of the chamber. Shown in FIG. 2 are variations in peak intensities of the mass numbers of HF, HCl, and Cl, which were measured in units of the exhausting step. From the characteristic curves shown in FIG. 2, it can be seen that no peak is detected with respect to either one of HF, HCl, and Cl after seven-time repetitions of the cycle of exhausting and gas supply, and sufficient purge processes were performed. Monitoring performed in this manner enables a necessary minimum number of purge processes to be implemented.

In the present embodiment, while only nitrogen was used as a gas in the purge time, the present embodiment is similarly effective even in the cases gas is added as described in relation to the first through third embodiments. It was confirmed that in any cases where gas was added, the residual F or Cl concentration was lower than a detection limit with seven or smaller number of the cycles. That is, the number of cycles and time were further decreased.

According to the present embodiment, the purge time can be shortened, and the operation rate of the apparatus can be increased.

Hereinafter, a fifth embodiment of the present invention will be described.

Also in this embodiment, cleaning was performed using the $ClF_3$ gas for the inside of the chamber in a state where a silicon film is deposited to the inside of the chamber, as in the first embodiment.

A purge process after the cleaning was performed using nitrogen. The purge cycle of the exhausting step and the nitrogen supply step was repeated. Particularly, in the nitrogen supply step according to the present embodiment, the conductance on the exhaust side was controlled so that the pressure rises to be as high as 400 Torr in the state where 10 slm nitrogen is caused to flow. The results thereof were monitored using the Q-mass spectrometer, and were investigated. As a result, it was confirmed that compared with the first to fourth embodiments in which the exhaust-side conductance control was not performed, while the required number of purge cycles in those cases is five, the number of necessary purge processes was decreased from five times to four times.

Thus, such effects as described above take place by raising the pressure when causing the nitrogen to flow. The reason for the above is that since the frequency of attack by the nitrogen to residual halogen deposited to the chamber wall and the like is increased, the desorbing efficiency of the halogen is increased. This enables sufficient removal of the residual halogen to be attained even with the smaller number of purge cycles.

In the present embodiment, the pressure at the time of exhausting was 1 mTorr, the control pressure at the time of making the nitrogen to flow was 400 Torr, and the pressure difference thereof was a value of five or more digits. In addition, comparisons were carried out for the purge efficiencies at various controlled pressures. It was confirmed through the comparisons that with a pressure difference being represented by three or more digits at each of the exhausting times and the nitrogen supply time, a high purge efficiency can be attained.

According to the present embodiment, the purge time can be shortened, and the operation rate of the apparatus can be increased.

Hereinafter, a sixth embodiment of the present invention will be described.

Also in this embodiment, cleaning was performed using the $ClF_3$ gas for the inside of the chamber in a state where a silicon film is deposited to the inside of the chamber, as in the first embodiment.

In the cleaning process, control was performed for the chamber temperature to 400° C. and exhaust pipe temperature to 50° C. In the purge step, control was performed for the chamber temperature to 850° C. and exhaust pipe temperature to 150° C. In this way, the chamber temperature and the exhaust pipe temperature in the purge step were controlled to the temperatures higher than those in the cleaning step. This control enables the desorbing efficiency of the deposited gas to be increased and enables the purge efficiency to be increased. Actually, when a monitoring was performed using the Q-mass spectrometer, it was confirmed that, while the number of necessary purge cycles was decreased from five times to four times.

In the present embodiment, description has been made with reference to the case where the purge step was performed in association with the cleaning process using $ClF_3$. However, the purge step is not limited to be performed in association with the cleaning process, and may be performed in association with a process using a gas containing halogen as a source gas. For example, the purge step may be performed in association with a CVD process using $SiH_2Cl_2$ as a source gas.

Further, in the present embodiment, the temperature in the chamber and the temperature of the exhaust pipe in the purge step were controlled to 850° C. and 150° C., respectively. However, the temperatures are not limited to these temperatures, and may be appropriately modified depending on the levels up to which the temperatures can be increased and the time required in increasing or decreasing the temperatures.

According to the present embodiment, the purge time can be shortened, and the operation rate of the apparatus can be increased.

As described above, while the purge methods have been disclosed in the first to sixth embodiments, these purge methods may of course be performed in a combined scheme thereof. This enables higher purge efficiency than in the case where these methods are independently performed.

Hereinafter, a seventh embodiment of the present invention will be described.

Also in this embodiment, cleaning was performed using the $ClF_3$ gas for the inside of the chamber in a state where a silicon film is deposited to the inside of the chamber, as in the first embodiment.

Thereafter, the inside of the chamber was purged with nitrogen. A polycrystalline silicon film was deposited over a semiconductor wafer under the conditions with a 300 sccm silane gas, a pressure of 1 Torr, and a temperature of 600° C. in a state where it is confirmed by monitoring using the Q-mass spectrometer that HF remains in the inside of the chamber.

When impurity contained in the deposited film was measured using a SIMS, it was confirmed that F (fluorine) with a peak concentration of $10^{18} cm^{-3}$ exists at an interface between the semiconductor wafer and the deposited film.

This film was patterned to form gate electrodes of MOS capacitors, and the formed MOS capacitors were tested by performing TDDB (time dependent dielectric breakdown) measurement, and it was confirmed that the ratio of MOS capacitors causing breakdown in a short time is lower compared to MOS capacitors having a gate electrode not containing F.

The reason for that such advantage was obtained by using F is considered that F has a property of compensating for a defect present in a gate oxide film, as described in the publication "IEEE International Reliability Physics Symposium Proceedings," $37^{th}$ Annual (Cat. No. 99CH36296) (USA), by Y. Mitani et. al., p.p. 93–8.

As described above, in the method according to the present embodiment, the polycrystalline silicon film is deposited over the semiconductor wafer in a state where a predetermined amount of gas remained in the chamber, so that a structure having advantages on the device is provided without increasing the number of process steps.

A semiconductor wafer such as silicon is inserted into the chamber 2 of the semiconductor manufacturing apparatus (CVD apparatus) dry-cleaned in accordance with the purge method described in each of the embodiments, and is mounted on the boat 10. Then, in the chamber 2, a CVD film such as a silicon oxide film is deposited over the semiconductor wafer 12, and then post treatment process are carried out to form a semiconductor device.

According to the present invention, a method of purging a semiconductor manufacturing apparatus and a method of manufacturing a semiconductor device are provided, in which the purge efficiency is increased and the purge time is shortened, thereby increasing the rate of operation of the semiconductor manufacturing apparatus.

What is claimed is:

1. A method of purging a semiconductor manufacturing apparatus, comprising:
   a step of etching a CVD-deposited film deposited in a chamber constituting a semiconductor manufacturing apparatus which has performed a process of forming a CVD film using a CVD method over a semiconductor wafer, by using a cleaning gas containing at least a halogen gas;
   a step of purging the cleaning gas remaining in the chamber by causing a gas containing hydrogen to flow into the chamber after the step of etching the CVD-deposited film by using the cleaning gas; and
   monitoring the cleaning gas remaining in the chamber to detect completion of the purge of the cleaning gas.

2. The method of purging a semiconductor manufacturing apparatus according to claim 1, wherein the gas containing the hydrogen in the step of purging is a mixed gas of hydrogen and nitrogen.

3. The method of purging a semiconductor manufacturing apparatus according to claim 2, wherein the content of the hydrogen of the mixed gas in the step of purging is in a range of approximately 10 sccm to approximately 10 slm, and the content of the nitrogen of the mixed gas is in a range of from 0 sccm to approximately 10 slm.

4. The method of purging a semiconductor manufacturing apparatus according to claim 1, wherein the cleaning gas in the step of etching is a $ClF_3$ gas.

5. A method of manufacturing a semiconductor device comprising:
   a step of mounting a semiconductor wafer in a chamber purged using the method of purging a semiconductor manufacturing apparatus according to any one of claims 1 to 4; and
   a step of forming a CVD film over the semiconductor wafer mounted in the chamber.

6. The method of purging a semiconductor manufacturing apparatus according to claim 1, wherein the monitoring of the cleaning gas is carried out by mass spectroscopy of the cleaning gas remaining in the chamber.

7. The method of purging a semiconductor manufacturing apparatus according to claim 1, wherein in the purging of the cleaning gas, pressure in the chamber is changed to change an exhaust rate of the cleaning gas.

8. The method of purging a semiconductor manufacturing apparatus according to claim 1, wherein the pressure is changed to vary in the range of three digits or more.

9. The method of purging a semiconductor manufacturing apparatus according to claim 1, wherein temperatures of the chamber and an exhaust tube connected to the chamber in the purging of the cleaning gas are set higher than temperatures applied thereto in the forming of the CVD film.

10. The method of purging a semiconductor manufacturing apparatus according to claim 1, wherein the cleaning gas remaining in the chamber is used as a doping gas in a subsequent step.

11. A method of purging a semiconductor manufacturing apparatus, comprising:
    a step of etching a CVD-deposited film deposited in a chamber constituting a semiconductor manufacturing apparatus which has performed a process of forming a CVD film using a CVD process over a semiconductor wafer, by using a cleaning gas containing at least a halogen gas;
    a step of purging the cleaning gas remaining in the chamber by causing a gas containing water-vapor to flow into the chamber after the step of etching the CVD-deposited film by using the cleaning gas; and
    a step of monitoring the cleaning gas remaining in the chamber to detect completion of the purge of the cleaning gas.

12. The method of purging a semiconductor manufacturing apparatus according to claim 11, wherein the gas containing the water-vapor in the step of purging is a mixed gas of water-vapor and nitrogen.

13. The method of purging a semiconductor manufacturing apparatus according to claim 12, wherein the content of the water-vapor of the mixed gas in the step of purging is in a range of approximately 5 sccm to approximately 500 sccm, and the content of the nitrogen of the mixed gas is in a range of from 10 sccm to approximately 10 slm.

14. The method of purging a semiconductor manufacturing apparatus according to claim 11, wherein the cleaning gas in the step of etching is a $ClF_3$ gas.

15. A method of manufacturing a semiconductor device comprising:
    a step of mounting a semiconductor wafer in a chamber purged using the method of purging a semiconductor manufacturing apparatus according to any one of claims 11 to 14; and
    a step of forming a CVD film over the semiconductor wafer mounted in the chamber.

16. The method of purging a semiconductor manufacturing apparatus according to claim 11, wherein the monitoring of the cleaning gas is carried out by mass spectroscopy of the cleaning gas remaining in the chamber.

17. The method of purging a semiconductor manufacturing apparatus according to claim 11, wherein in the purging of the cleaning gas, pressure in the chamber is changed to change an exhaust rate of the cleaning gas.

18. The method of purging a semiconductor manufacturing apparatus according to claim 11, wherein the pressure is changed to vary in the range of three digits or more.

19. The method of purging a semiconductor manufacturing apparatus according to claim 11, wherein temperatures of the chamber and an exhaust tube connected to the chamber in the purging of the cleaning gas are set higher than temperatures applied thereto in the forming of the CVD film.

20. The method of purging a semiconductor manufacturing apparatus according to claim 11, wherein the cleaning gas remaining in the chamber is used as a doping gas in a subsequent step.

21. A method of purging a semiconductor manufacturing apparatus, comprising:
    a step of etching a CVD-deposited film deposited in a chamber constituting a semiconductor manufacturing apparatus which has performed a process of forming a CVD film using a CVD process over a semiconductor wafer, by using a cleaning gas containing at least a halogen gas; and a step of purging the cleaning gas remaining in the chamber by causing a gas containing a substance, which becomes alkali upon being dissolved in water, to flow into the chamber after the step of etching the CVD-deposited film by using the cleaning gas; and a step of monitoring the cleaning gas remaining in the chamber to detect completion of the purge of the cleaning gas.

22. The method of purging a semiconductor manufacturing apparatus according to claim 21, wherein the gas containing the substance that becomes alkali upon being dissolved in water in the step of purging is a mixed gas of substance that becomes alkali upon being dissolved in water and nitrogen.

23. The method of purging a semiconductor manufacturing apparatus according to claim 21, wherein the cleaning gas in the step of etching is a $ClF_3$ gas.

24. A method of manufacturing a semiconductor device comprising:

a step of mounting a semiconductor wafer in a chamber purged using the method of purging a semiconductor manufacturing apparatus according to any one of claims 21 to 23; and a step of forming a CVD film over the semiconductor wafer mounted in the chamber.

25. The method of purging a semiconductor manufacturing apparatus according to claim 21, wherein the monitoring of the cleaning gas is carried out by mass spectroscopy of the cleaning gas remaining in the chamber.

26. The method of purging a semiconductor manufacturing apparatus according to claim 21, wherein in the purging of the cleaning gas, pressure in the chamber is changed to change an exhaust rate of the cleaning gas.

27. The method of purging a semiconductor manufacturing apparatus according to claim 21, wherein the pressure is changed to vary in the range of three digits or more.

28. The method of purging a semiconductor manufacturing apparatus according to claim 21, wherein temperatures of the chamber and an exhaust tube connected to the chamber in the purging of the cleaning gas are set higher than temperatures applied thereto in the forming of the CVD film.

29. The method of purging a semiconductor manufacturing apparatus according to claim 21, wherein the cleaning gas remaining in the chamber is used as a doping gas in a subsequent step.

30. A method of purging a semiconductor manufacturing apparatus, comprising:

a step of etching a CVD-deposited film deposited in a chamber constituting a semiconductor manufacturing apparatus which has performed a process of forming a CVD film using a CVD process over a semiconductor wafer, by using a cleaning gas containing at least a halogen gas;

a step of purging the cleaning gas remaining in the chamber by causing ammonia to flow into the chamber after the step of etching the CVD-deposited film by using the cleaning gas; and a step of monitoring the cleaning gas remaining in the chamber to detect completion of the purge of the cleaning gas.

31. The method of purging a semiconductor manufacturing apparatus according to claim 30, wherein the ammonia in the step of purging is a mixed gas of ammonia and nitrogen.

32. The method of purging a semiconductor manufacturing apparatus according to claim 31, wherein the content of the ammonia in the step of purging is in a range of approximately 100 sccm to approximately 2 slm, and the content of the nitrogen of the mixed gas is in a range of from 10 sccm to approximately 10 slm.

33. The method of purging a semiconductor manufacturing apparatus according to claim 30, wherein the cleaning gas in the step of etching is a $ClF_3$ gas.

34. The method of purging a semiconductor manufacturing apparatus according to claim 30, wherein the temperature in the chamber when ammonia is caused to flow into the chamber is approximately 800° C. or higher.

35. A method of manufacturing a semiconductor device comprising:

a step of mounting a semiconductor wafer in a chamber purged using the method of purging a semiconductor manufacturing apparatus according to any one of claims 30 to 34; and a step of forming a CVD film over the semiconductor wafer mounted in the chamber.

36. The method of purging a semiconductor manufacturing apparatus according to claim 30, wherein the monitoring of the cleaning gas is carried out by mass spectroscopy of the cleaning gas remaining in the chamber.

37. The method of purging a semiconductor manufacturing apparatus according to claim 30, wherein in the purging of the cleaning gas, pressure in the chamber is changed to change an exhaust rate of the cleaning gas.

38. The method of purging a semiconductor manufacturing apparatus according to claim 30, wherein the pressure is changed to vary in the range of three digits or more.

39. The method of purging a semiconductor manufacturing apparatus according to claim 30, wherein temperatures of the chamber and an exhaust tube connected to the chamber in the purging of the cleaning gas are set higher than temperatures applied thereto in the forming of the CVD film.

40. The method of purging a semiconductor manufacturing apparatus according to claim 30, wherein the cleaning gas remaining in the chamber is used as a doping gas in a subsequent step.

* * * * *